US012696774B2

(12) United States Patent
Uchinuma et al.

(10) Patent No.: US 12,696,774 B2
(45) Date of Patent: **\*Jul. 28, 2026**

(54) SEMICONDUCTOR DEVICE AND CONTROL SYSTEM

(71) Applicant: RENESAS ELECTRONICS CORPORATION, Tokyo (JP)

(72) Inventors: Yoshimasa Uchinuma, Tokyo (JP); Takehiro Ueda, Tokyo (JP)

(73) Assignee: Renesas Electronics Corporation, Tokyo (JP)

( \* ) Notice: Subject to any disclaimer, the term of this patent is extended or adjusted under 35 U.S.C. 154(b) by 535 days.

This patent is subject to a terminal disclaimer.

(21) Appl. No.: 18/307,405

(22) Filed: Apr. 26, 2023

(65) Prior Publication Data

US 2024/0363500 A1      Oct. 31, 2024

(51) Int. Cl.
_H10W 70/40_        (2026.01)
_H10W 90/00_        (2026.01)

(52) U.S. Cl.
CPC ....... _H10W 70/481_ (2026.01); _H10W 70/461_ (2026.01); _H10W 70/465_ (2026.01); _H10W 90/756_ (2026.01)

(58) Field of Classification Search
CPC ........... H01L 23/49562; H01L 23/4952; H01L 23/49568; H01L 24/48; H01L 2224/48247; H01L 2924/13055; H01L 2924/13091; H01L 23/49524; H01L 23/49575; H01L 24/45; H01L 24/49
See application file for complete search history.

(56) References Cited

U.S. PATENT DOCUMENTS

| | | | |
|---|---|---|---|
| 8,633,723 B2 * | 1/2014 | Takeuchi | H10D 30/668 |
| | | | 327/540 |
| 9,704,979 B2 | 7/2017 | Muto et al. | |
| 10,031,164 B2 | 7/2018 | Takada et al. | |
| 11,373,941 B2 | 6/2022 | Uchinuma et al. | |
| 2008/0054422 A1 | 3/2008 | Koike et al. | |
| 2013/0049137 A1 * | 2/2013 | Uno | H01L 24/40 |
| | | | 257/E27.06 |
| 2013/0181228 A1 | 7/2013 | Usui et al. | |
| 2014/0015046 A1 | 1/2014 | Thiele et al. | |
| 2016/0064312 A1 | 3/2016 | Bando | |

(Continued)

FOREIGN PATENT DOCUMENTS

| | | | | |
|---|---|---|---|---|
| JP | 2017-069412 A | 4/2017 | | |
| WO | WO-2022249806 A1 * | 12/2022 | | H01L 25/18 |

_Primary Examiner_ — Teresa M. Arroyo
(74) _Attorney, Agent, or Firm_ — Rimon P.C.

(57) ABSTRACT

A semiconductor device includes a first source electrode coupled to a first source terminal by a connection portion and having first and second slits on two opposite sides, a second source electrode coupled to a second source terminal, a Kelvin pad formed independently of the first source electrode, a power MOSFET coupled between the first source electrode and a drain terminal, a sense MOSFET coupled between the second source electrode and the drain terminal, a first wire coupled between a first source potential extraction port set at the first slit and the Kelvin pad, a second wire coupled between a second source potential extraction port set at the second slit and the Kelvin pad, wherein the connection portion has third and fourth slits corresponding to the first and second slits.

8 Claims, 12 Drawing Sheets

(56) References Cited

U.S. PATENT DOCUMENTS

| | | | |
|---|---|---|---|
| 2017/0338190 A1* | 11/2017 | Fujino | H01L 23/562 |
| 2020/0105723 A1* | 4/2020 | Hagiwara | H01L 21/4825 |
| 2021/0118781 A1 | 4/2021 | Hasegawa et al. | |
| 2024/0079372 A1* | 3/2024 | Omae | H01L 24/49 |

* cited by examiner

|  | Prior art | First embodiment |
|---|---|---|
| Chip-X | 4.1 mm | 4.1 mm |
| Chip-Y | 2.65 mm | 2.65 mm |
| a | 3.3 mm | 3.3 mm |
| b | - | 0.29 mm |
| c | 0.23/0.23 mm<br>0.6 mm/0.7 mm | 0.625/0.625 mm<br>- |
| RD | 0.020 mΩ | 0.020 mΩ |
| RT1 | 0.844 mΩ | 0.825 mΩ |
| RS1 | 0.156 mΩ | 0.134 mΩ |
| RM | 0.142 mΩ | 0.142 mΩ |
| RL1 | 0.005 mΩ | 0.005 mΩ |
| RDS (on) | 1.167 mΩ | 1.126 mΩ  (-3.64%) |

SEMICONDUCTOR DEVICE AND CONTROL SYSTEM

BACKGROUND

The present invention relates to a semiconductor device, particularly a semiconductor device and a control system having a power semiconductor device.

Electric power devices are used in power tools, mobile devices, power conditioners, UPS, motor control circuits, and the like, which are equipped with control circuits for charging and discharging batteries. Power MOSFET or IGBT (Insulated Gate Bipolar Transistor) is used as the power device.

In a semiconductor device using a power MOSFET (or IGBT), it is important to detect a current flowing from a power MOSFET to a load in order to control a current flowing from the power MOSFET to the load and to detect a short-circuit failure of the load. Sense MOSFET connected in parallel with a power MOSFET are widely used to detect the current flowing from the power MOSFET to the load. By configuring the circuitry such that the current: flowing in the sense MOSFET is at a predetermined ratio (sense ratio) with respect to the current flowing in the power MOSFET, the current value flowing in the power MOSFET can be converted from the current value of the sense MOSFET.

It is disclosed in Patent Document 1 that a plurality of source potential extraction ports are provided in a source electrode of a power MOSFET, thereby suppressing an effect on a sense-ratio caused by a variation in a connecting position between a source pad and a metal plate (or a wire).

PRIOR-ART DOCUMENT

Patent Document

[Patent Document 1] U.S. Pat. No. 11,373,941

SUMMARY

According to the technique disclosed in Patent document 1, it is possible to suppress the variation in the sense ratio caused by the connection position of the metal plate (or the wire), but further improvement measures are required.

Other problems and novel features will become apparent from the description of the present specification and the drawings.

A semiconductor device includes a first source electrode coupled to a first source terminal by a connection portion and having first and second slits on two opposite sides, a second source electrode coupled to a second source terminal, a Kelvin pad formed independently of the first source electrode, a power MOSFET coupled between the first source electrode and a drain terminal, a sense MOSFET coupled between the second source electrode and the drain terminal, a first wire coupled between a first source potential extraction port set at the first slit and the Kelvin pad, a second wire coupled between a second source potential extraction port set at the second slit and the Kelvin pad, wherein the connection portion has third and fourth slits corresponding to the first and second slits.

Semiconductor device according to an embodiment suppresses variations of sense ratio and allows the current flowing through the power MOSFET (or IGBT) to be measured with high accuracy.

BRIEF DESCRIPTION OF THE DRAWINGS

FIG. 3 is a structural diagram of a sense MOSFET according to the first embodiment.

FIG. 5 is a structural diagram of a semiconductor device according to the first embodiment.

FIG. 7 is a circuit diagram of the semiconductor chip according to the first embodiment.

FIG. 8 is a potential distribution diagram of the semiconductor chip according to the first embodiment.

FIG. 9 is a table for comparing the prior art with the first embodiment.

FIG. 11 is a plan view of a semiconductor chip according to a second embodiment.

FIG. 12 is a structural diagram of a semiconductor device according to the second embodiment.

DETAILED DESCRIPTION

Figure 1:
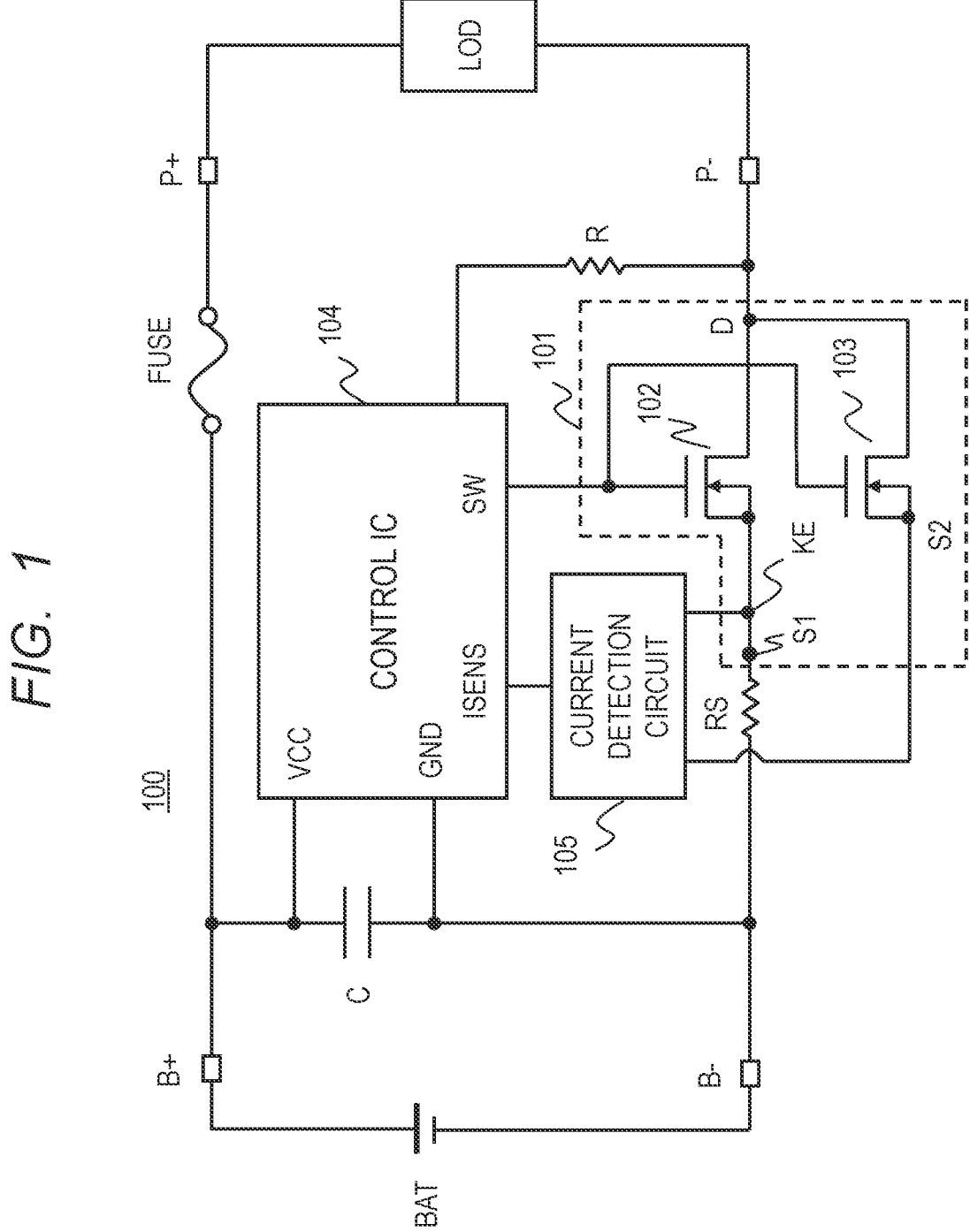
FIG. 1 is a block diagram of a control system according to a first embodiment.

Hereinafter, a semiconductor device according to an embodiment will be described in detail with reference to the drawings. In the specification and the drawings, the same configuration elements or corresponding constituent elements are denoted by the same reference numerals, and redundant descriptions thereof will be omitted. In addition, in the drawings, configurations may be omitted or simplified for convenience of explanation. At least some of the embodiments may be arbitrarily combined with each other.

First Embodiment

FIG. 1 is a block-diagram illustrating a configuration of a control system 100 using a power MOSFET (or IGBT) and a sense MOSFET. Here, a battery-protection-system for a LiB (lithium-ion battery) will be described as an example.

As illustrated in FIG. 1, the control system (battery protection system) 100 is a system that supplies power from a battery (BAT) connected between terminals B+ and B- to a load (LOD) such as a motor connected between terminals P+ and P-, or that receives power from a load and charges the battery. The battery protection system 100 includes a semiconductor device 101, a control IC 104, a current detection circuit 105, capacitor C, resistor RS, R, and fuse. The capacitor C is a device for stabilizing the power supply voltage of the control IC 104. The resistor RS is a device for detecting a current. The resistor R is an ESD protective device. The fuse is an overcurrent protection element.

The semiconductor device 101 includes a semiconductor chip 200 having a power MOSFET (also referred to as a main MOSFET) 102 and a sense MOSFET 103. Here, the path between the terminals B+ and P+ is referred to as a high-side wiring. The path between the terminal B- and P- is referred to as a low-side wire. The power MOSFET 102 and the sense MOSFET 103 are connected in parallel on the low-side wire. The power MOSFET 102 and the sense MOSFET 103 constitute a current mirror. D is a drain terminal. S1 is a source-terminal of the power MOSFET 102. S2 is a source-terminal of the sense MOSFET 103. KE is the Kelvin terminal of the powered MOSFET 102. FIG. 1 shows a configuration in which discharging flow control from a battery (BAT) to a load (LOD) is performed. When the respective sources of the power MOSFET 102 and the sense MOSFET 103 are connected to the terminal P– and the respective drains of the power MOSFET 102 and the sense MOSFET 103 are connected to the terminal B–, charge flow control is performed. The present embodiment is applicable to any configuration.

The control IC 104 controls the power to the load and the charge to the battery and generates a gate signal to the power MOSFET 102 and the sense MOSFET 103.

The current detection circuit 105 is connected to the terminal KE and the terminal S2, and is configured to detect a current flowing through the sense MOSFET 103. The detected current is sent to the control IC 104. When the current detection circuit 105 detects an overcurrent or the like, the control IC 104 turns off the gate of the power MOSFET 102 and cuts off the current.

Figure 2:
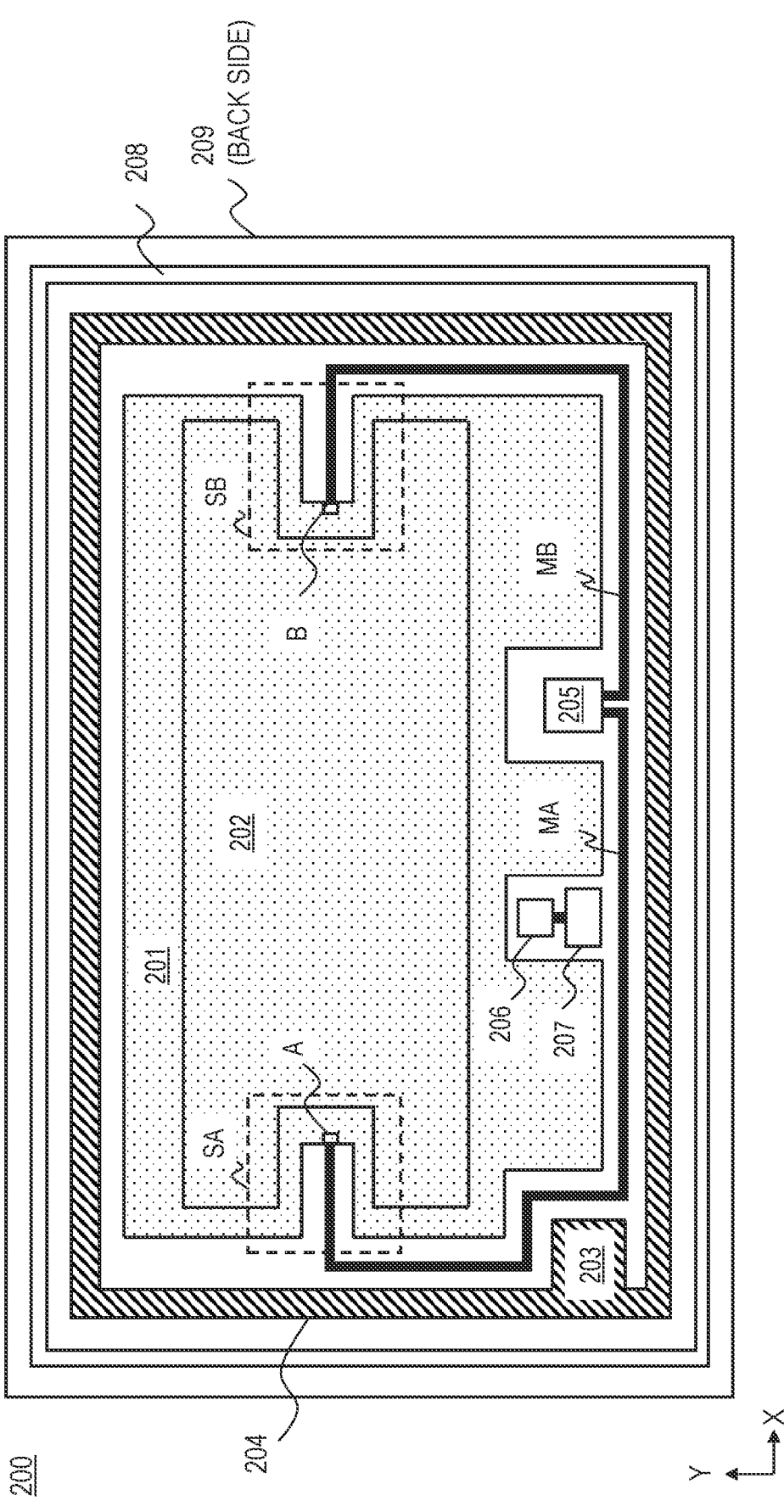
FIG. 2 is a plan view of a semiconductor chip according to the first embodiment.

Next, the structure of the semiconductor chip 200 will be described with reference to FIG. 2. FIG. 2 is a plan view of the semiconductor chip 200 in a state where the insulating film is made transparent for ease of understanding. The semiconductor chip 200 is called as a vertical power MOS-FET, and a source electrode and a gate electrode are formed on a front surface (first surface) of the semiconductor chip 200, and a drain electrode is formed on a back surface (second surface). The drain electrode is a metal layer made of Au or Ag. As shown in FIG. 2, a large part of the semiconductor chip 200 is covered with the source electrode 201 of the power MOSFET 102. The power MOSFET 102 is formed below the source electrode 201. A source pad 202 of the power MOSFET 102 (an insulating film opening of the source electrode 201) is formed in the source electrode 201. The sense MOSFET 103 is formed below the source electrode 207 of the sense MOSFET 103. The source pad 206 of the sense MOSFET 103 is formed adjacently to the source electrode 207. The source pad 206 is smaller in size than the source pad 202. A gate line 204 is formed to surround the power MOSFET 102 and the sense MOSFET 103. The gate pad 203 is formed to be connected to the gate wiring 204. A guard ring 208 is formed around the semiconductor chip 200. A drain pad 209 is formed on the back surface of the semiconductor chip 200.

The source-electrode 201 has slits SA and SB. The slits SA, SB are provided so as to face each other in the X-axis direction. The source pad 202 also has slits along the slits SA, SB. A source-potential extraction port A is provided in the slit SA. A source-potential extraction port B is provided in the slit SB.

The Kelvin pad 205 of the power MOSFET 102 is not formed on the source electrode 201 but is formed separately from the source electrode 201. The Kelvin pad 205 is connected to the source-potential extraction port A by a wire MA. Further, the Kelvin pad 205 is connected to the source-potential extraction port B by a wire MB. The wires MA, MB are provided between the gate wiring 204 and the source electrode 201.

The resistive value of each of the wires MA, MB may be any value. However, when the current flowing through the detection MOSFET 102 is actually detected, a current of about 1 to 10 µA flows. The potential read by the current detection circuit 105 is 200 mV, and the detection current is 10 µA. When each wire resistor of the wires MA, MB is 20 Ω, the voltage read by the current detection circuit 105 includes an error of 0.1%. When each wire resistor of the wires MA, MB is 2 Ω, the voltage read by the current detection circuit 105 includes an error of 0.01%. Therefore, the smaller the wiring resistors of the wires MA, MB such that they do not interfere with the performance of RDS1(on), the smaller the effect on the current detecting accuracy. Each wire resistor of the wires MA, MB is preferably a resistance of approximately 10 Ω or less.

Figure 3:
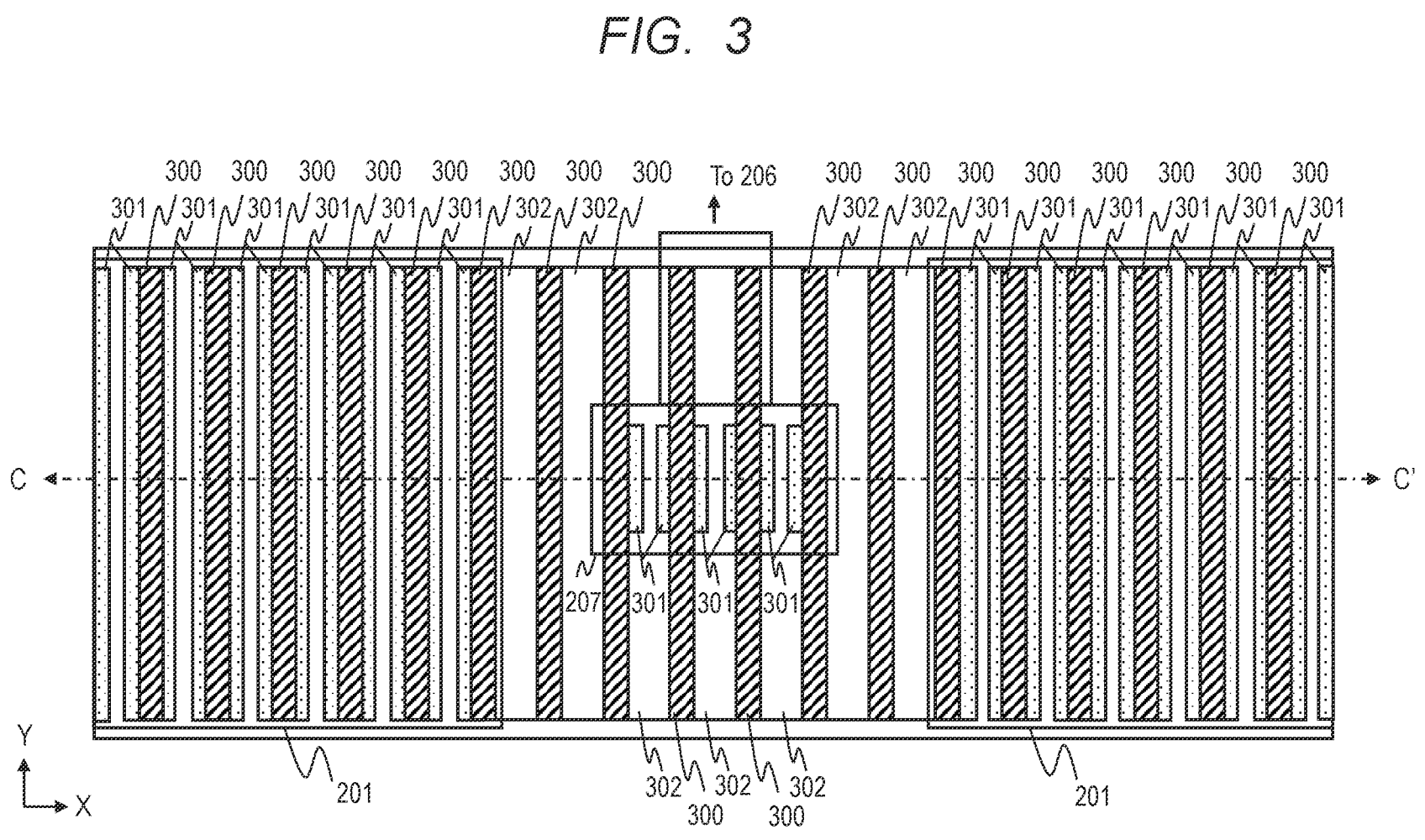
Figure 4:
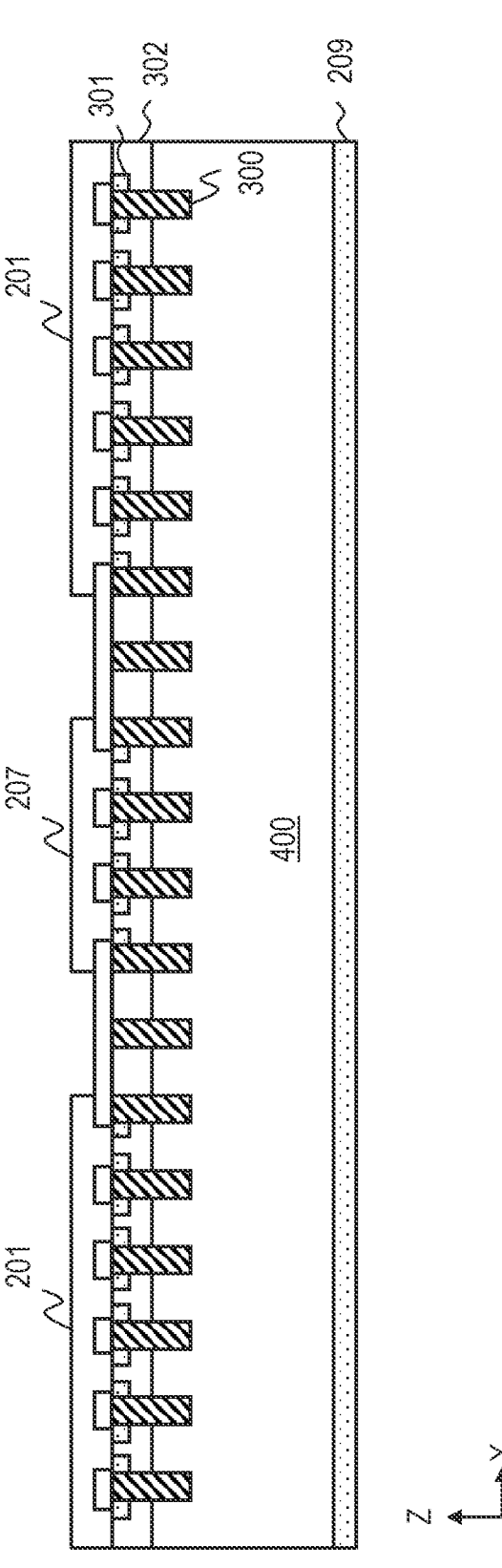
FIG. 4 is a structural diagram of the sense MOSFET according to the first embodiment.
Figure 4:
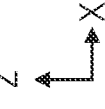

Next, the configuration of the sense MOSFET 103 will be described with reference to FIGS. 3 and 4. FIG. 3 is an enlarged plan view of the periphery of the source pad 206 and the source electrode 207 under which the sense MOS-FET 103 is formed. FIG. 4 is a cross-sectional view taken along C-C' line of FIG. 3. As illustrated in FIGS. 3 and 4, the semiconductor chip 200 includes a trench gate 300, an N+ type source layer 301, a P type base layer 302, and an N type semiconductor substrate 400. The semiconductor chip 200 is similar to a conventional vertical power MOSFET, and will not be described. The simplest device isolation method of the power MOSFET 102 and the sense MOSFET 103 is a method of forming an ineffective area in which the N+ type source layer 301 is not formed in the silicon layer and separating an aluminum interconnect layer by patterning. Accordingly, the power MOSFET 102 and the sense MOS-FET103 have a common gate terminal and a common drain terminal. Each of the power MOSFET 102 and the sense MOSFET 103 has an independent source terminal.

Figure 5:
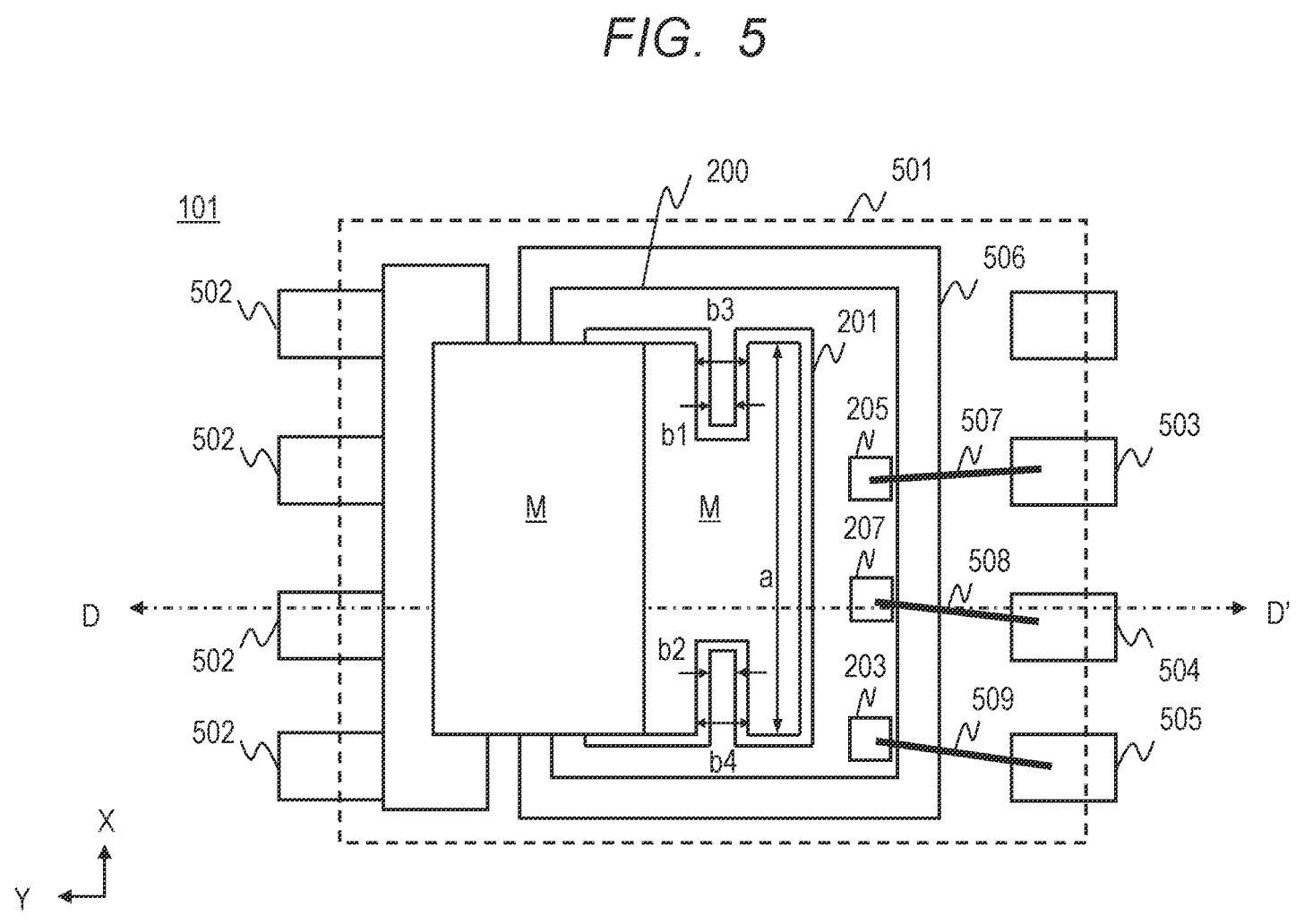
Figure 6:
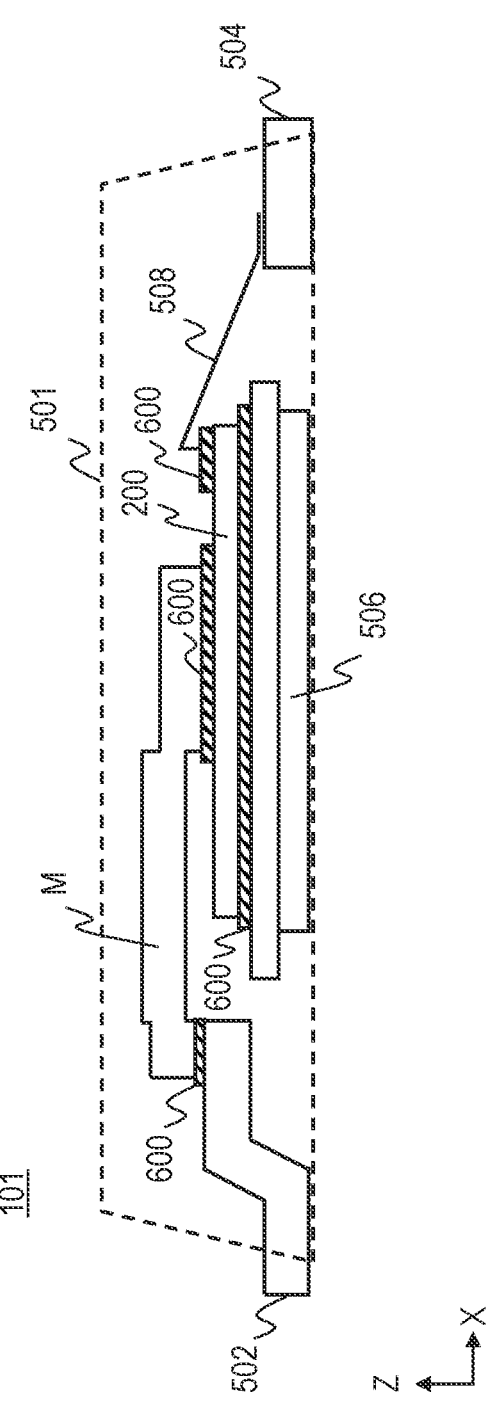
FIG. 6 is a structural diagram of the semiconductor device according to the first embodiment.

Next, the structure of the semiconductor device (semi-conductor package) 101 on which the semiconductor chip 200 is mounted will be described with reference to FIGS. 5 and 6. FIG. 6 is a cross-sectional view taken along D-D' line of FIG. 5. The semiconductor chip 200 is sealed with a sealing portion (resin) 501. A connection portion M (first connection portion) is connected to the source electrode 201 (source pad 202) of the semiconductor chip 200 (power MOSFET 102). The connection portion M is connected to four lead frames 502 that are source terminals (first source terminals) of the semiconductor device 101. The connection portion M is a metal plate and is also called a clip.

The connection portion M has slits corresponding to the slits SA, SB of the source electrode 201 (the source pad 202). As shown in FIG. 5, the connection portion M and the source electrode 201 (the source pad 202) are connected to each other in such a manner that the slits are aligned with each other. The slits of the connection state M surround the source potential extraction ports A and B. In FIG. 5, b1, b2 are widths of the slits of the source electrode 201 (widths of the openings of the slits). b3, b4 are widths of the slits of the connection portion M. As is clear from FIG. 5, b3>b1, b4>b2. Although FIG. 5 shows an ideal connection state, there is a possibility that the connection position of the connection portion M is shifted in the X-axis direction and the Y-axis direction due to variations in manufacturing. Even if this deviation occurs, it is desirable that the slits SA, SB are not covered by the connection portion M.

The Kelvin pad 205 of the semiconductor chip 200 is connected to the lead frame 503, which is a Kelvin terminal of the semiconductor device 101, using a wire 507. The source pad 207 of the semiconductor chip 200 (sense MOSFET 103) is connected to the lead frame 504, which is a source terminal (second source terminal) for sense of the semiconductor device 101, using a wire 508 (second con-nection portion). The gate pad 203 is connected to the lead frame 505, which is a gate terminal of the semiconductor device 101, using a wire 509. The drain pad 209 on the back surface of the semiconductor chip 200 is connected to the drain terminal 506 of the semiconductor device 101. The wires 507, 508, and 509 may be metal plates. Note that a bonding material 600 typified by soldering, Ag pasting, or the like is used for the connecting.

Next, effects of the first embodiment will be described from three aspects. The first aspect is an effect on the variation in the sense ratio caused by the connection position of the connection portion M. A second aspect is an effect on the performance of the semiconductor chip 200. A third aspect is an effect on the variation in the sense ratio caused by the temperature change.

Figure 7:
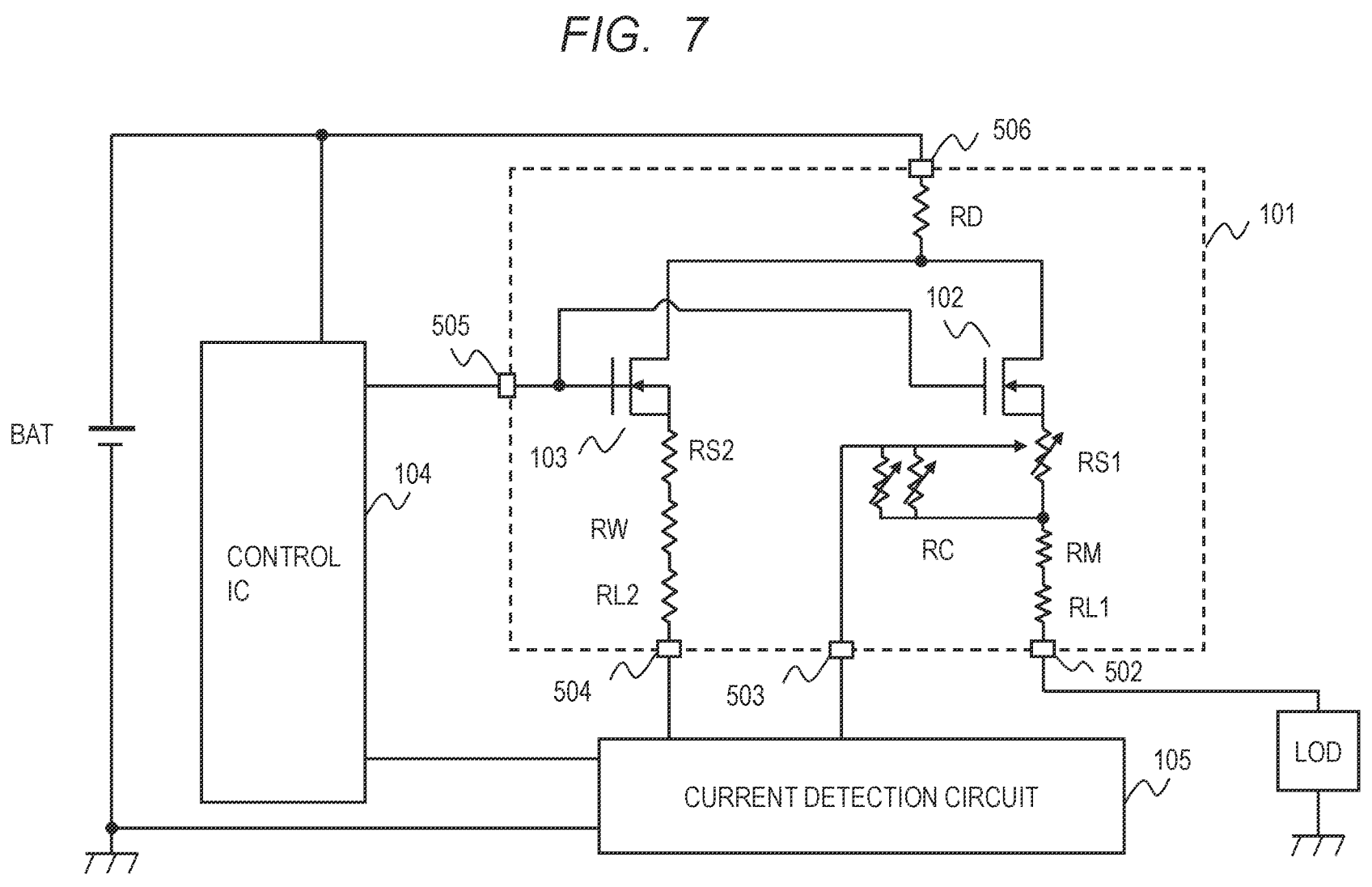

First, the effect from the first aspect will be described with reference to FIGS. 7 and 8. FIG. 7 is an equivalent circuit diagram of the semiconductor chip 200 considering the metal resistance. RL1 represents the metal resistance of the lead frame 502. RL2 represents the metal resistance of the lead frame 504. RM represents the metal resistance of connection portion M. RW represents the metal resistance of the wire 508. RS1 represents a resistance of a current path extending from the connection position of the connection portion M into XY plane in the source-electrode 201. RS2 represents a resistance of a current path from the connection position of the wire 508 to the source of the sense MOSFET 103. RC represents the resistive components that are not affected by the four-terminal voltage measuring method using the Kelvin terminal. The reason why RC is composed of two variable resistors is that, in the first embodiment, the source-potential extraction ports are two (A and B).

In FIG. 7, when the power MOSFET 102 is on-state, a resistance between the drain terminal 506 and the Kelvin terminal 503 is RDK(on). Similarly, a resistance between the drain terminal 506 and the source terminal 504 is RDS2(on). The on-resistance of the power MOSFET 102 is RT1, and the on-resistance of the sense MOSFET 103 is RT2. At this time, the sense-ratio SR is RDS2(on)/RDK(on)≈RT2/(RD+RT1+RS1−RC) (see Patent Document 1). Since RC is a resistance that varies depending on the connection position of the connection portion M, the sense-ratio SR varies depending on the connection position of the connection portion M.

Figure 8:
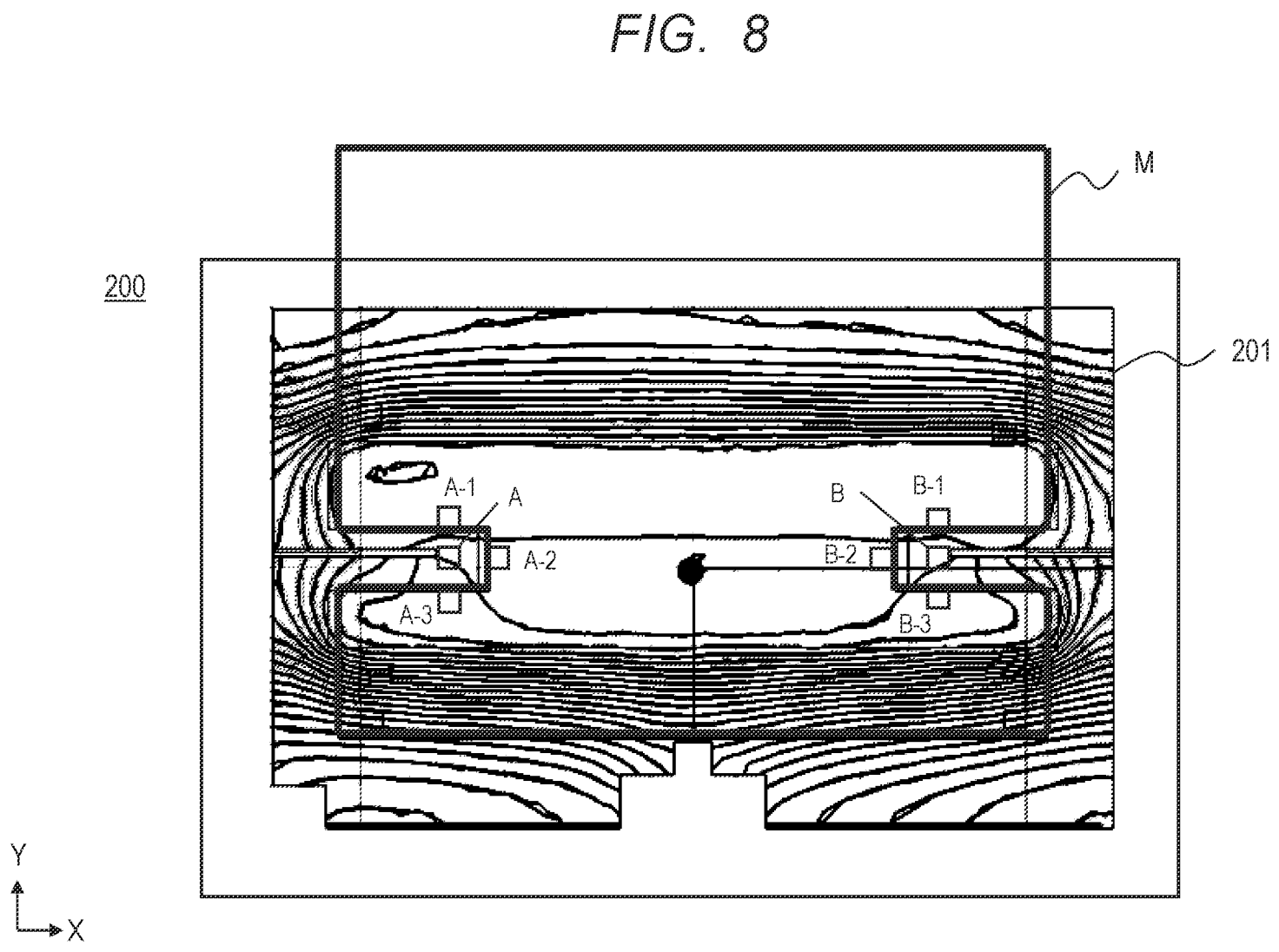

FIG. 8 shows a potential distribution on the source electrode 201 by an equipotential line when a particular current (e.g., 1 A) is supplied to the source electrode 201. As shown in FIG. 8, the connection position of the connection portion M and the source electrode 201 (the source pad 202) is substantially at a uniform potential.

Here, a case where the connection position of the connection portion M and the source electrode 201 (the source pad 202) vary will be considered. In FIG. 8, A-1, A-2, A-3 are points on three sides of the connection portion M, and are points near the source-potential extraction port A. Similarly, B-1, B-2, B-3 are points on three sides of the connection portion M, and are points near the source-potential extraction port B.

When the connection portion M is misaligned in the +Y direction, a distance between the source-potential extraction port A and A-1 increases, and a potential difference between A and A-1 increases. On the other hand, a distance between the source-potential extraction port A and A-3 becomes narrow, and a potential difference between A and A-3 becomes small. Since the interval between A and A-2 does not change, there is no change in a potential difference between A and A-2. The same applies to the source potential extraction port B. An average of the potential differences from A-1, A-2, A-3 appears at the source-potential extraction port A. An average of the potential differences from B-1, B-2, B-3 appears at the source-potential extraction port B. In the Kelvin pad 205, an average value of the potentials of the source potential extraction ports A and B appears. Therefore, even if the connection portion M is misaligned in +Y direction, a change in the potential detected by the Kelvin pad 205, that is, a change in RC is suppressed. The same can be said when the connection portion M is misaligned in −Y direction.

When the connection portion M is misaligned in +X direction, a distance between the source-potential extraction ports A and A-2 increases, and a potential difference between A and A-2 increases. On the other hand, a distance between the source-potential extraction ports B and B-2 becomes narrow, and a potential difference between B and B-2 becomes small. Since a distance between A and A-1, A-2 and a distance between B and B-1, B-2 do not change, there is no change in the potential at A-1, A-2, B-1, B-2. Therefore, even if the connection portion M is misaligned in +X direction, a change in the potential detected by the Kelvin pad 205, that is, a change in RC is suppressed. The same can be said when the connection portion M is misaligned in −X direction.

Therefore, in the first embodiment, even if the connection position of the connection portion M varies, a change in RC can be suppressed, and a change in the sense-ratio can be suppressed. Further, as can be seen from FIG. 8, the connection perimeter of the connection portion M and the source electrode 201 has a smaller potential change than the chip peripheral portion. The presence of the slits at a position where the potential change is small can be expected to have a high suppressing effect on the change in the sense ratio.

Figure 10:
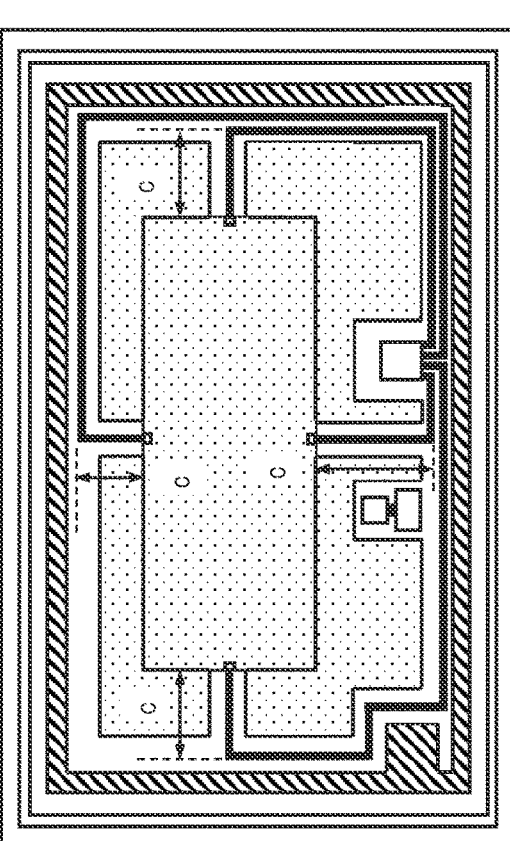
FIG. 10 is a diagram for comparing the prior art with the first embodiment.
Figure 10:
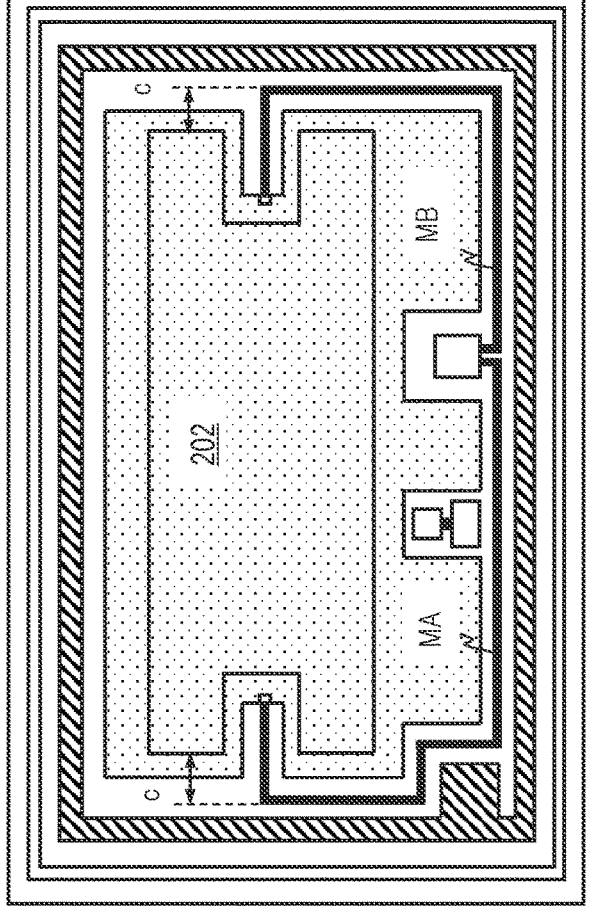
Figure 10:
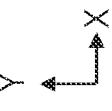

Next, the effect from the second aspect will be described with reference to FIGS. 9 and 10. FIG. 9 shows a comparison the first embodiment with the prior art (FIG. 18 of Patent Document 1) in terms of RDS(on). RDS(on) is the resistance between the drain terminal 506 and the source terminal 502 when the power MOSFET 102 is on. In order to evaluate the performance of the semiconductor chip 200, it is desirable that RDS(on) is low-resistance.

First, a condition by which RDS(on) is measured will be described The dimensions of the chip are 4.1 mm (X) and 2.65 mm (Y). The size "a" is a length of the connection portion M in the X-axis direction (see FIG. 5). The size "b" is a width (either of b1, b2 or both of b1, b2) of the slit in the connection portion M. The size "c" is a distance from the wires MA, MB to the source pad 202 (see FIG. 10). The size "c" (0.625 mm) of the first embodiment is set so that RC is the same as that of the prior art. By making RC the same, it is possible to compare the effects of the two methods except for RC. Since there is no slit in the prior art, there is no size "b" in the prior art. In the prior art, since there are four source potential extraction ports (A to D), there are four sizes "c" (see FIG. 10). The sizes "a" and "c" need to conform to design criterion of the semiconductor device 101. For example, the size "a" needs to be equal to or smaller than a predetermined value with respect to the size of the source pad. In addition, it is necessary to secure the size "c" at a predetermined value or more.

As shown in FIG. 9, RDS(on) can be reduced by 3.64% in the first embodiment as compared with the prior art. The reason for this is that an active region of the power MOSFET 102 (a region that operates as a transistor) is widened. In the first embodiment, since two wiring lines for connecting the two source potential extraction ports and the Kelvin terminal are required, the active region can be made wider than in the prior art.

Next, the effect from the third aspect will be described. It is generally known that a semiconductor device has a temperature characteristic in which characteristics change depending on temperature. Here, the temperature characteristics of the sense ratio will be considered. As described above, the sense-ratio SR=RDS2(on)/RDK(on) (Equation 1)

is used. FIG. 7 shows RDS2(on)=RD+RT2+RS2+RW+RL2 (Expression 2) and RDK(on)=RD+RT1+RS1–RC (Expression 3).

The sense-ratio SR has a thermal property. Here, the temperature coefficients of the sense-ratio SR, RDS2(on), RDK(on), metal (Cu, Al) used in the semiconductor device and the semiconductor chip including the channel resistor are Csr, Cs, Ck, Cm and Csi, respectively. Taking into account the temperature-change of ΔT, the above equations (2) and (3) are RDS2(on)*(Cs*ΔT+1)=RD*(Cm*ΔT+1)+ RT2*(Csi*ΔT+1)+RS2*(Cm*ΔT+1)+RW*(Cm*ΔT+1)+ RL2*(Cm*ΔT+1), RDK(on)*(Ck*ΔT+1)=RD*(Cm*ΔT+ 1)+RT1*(Csi*ΔT+1)–RC*(Cm*ΔT+1). Deformation results in Cs={Csi*RT2+Cm*(RD+RS2+RL2)}/RDS2(on), Ck={Csi*RT1+Cm*(RD+RS1–RC)}/RDK(on).

Equation (1) is SR*(Csr*ΔT+ 1)}/{RDK(on)*(Ck*ΔT+1)}. When this equation is modified, Csr *ΔT=(Cs*ΔT–Ck*ΔT)/(Ck*ΔT+1). Cs is dominated by RT2, but is less susceptible to manufacturing variations due to the small RT2 itself. Even if Cs varies, Ck also varies. Therefore, it can be said that the effect on Csr due to the variation of Cs is small. On the other hand, if Ck varies, Csr varies and the sense-ratio SR varies. In the first embodiment, as described above, by suppressing the variation in RC, the variation in Ck is suppressed. As a consequence, variations in the temperature-coefficient Csr of the sense-ratio SR can be suppressed.

As described above, in the semiconductor chip 200 of the first embodiment, the slits are provided in the source electrode 201 of the power MOSFET102, and the source potential extraction ports A and B are provided in the slits. Further, similar slits are provided in the connection portion M, and the connection portion M is connected so as to be aligned with the slits of the source electrode 201. Accordingly, even if the connection positions of the connection portions M vary, the influence on the sense ratio can be suppressed.

Second Embodiment

Figure 11:
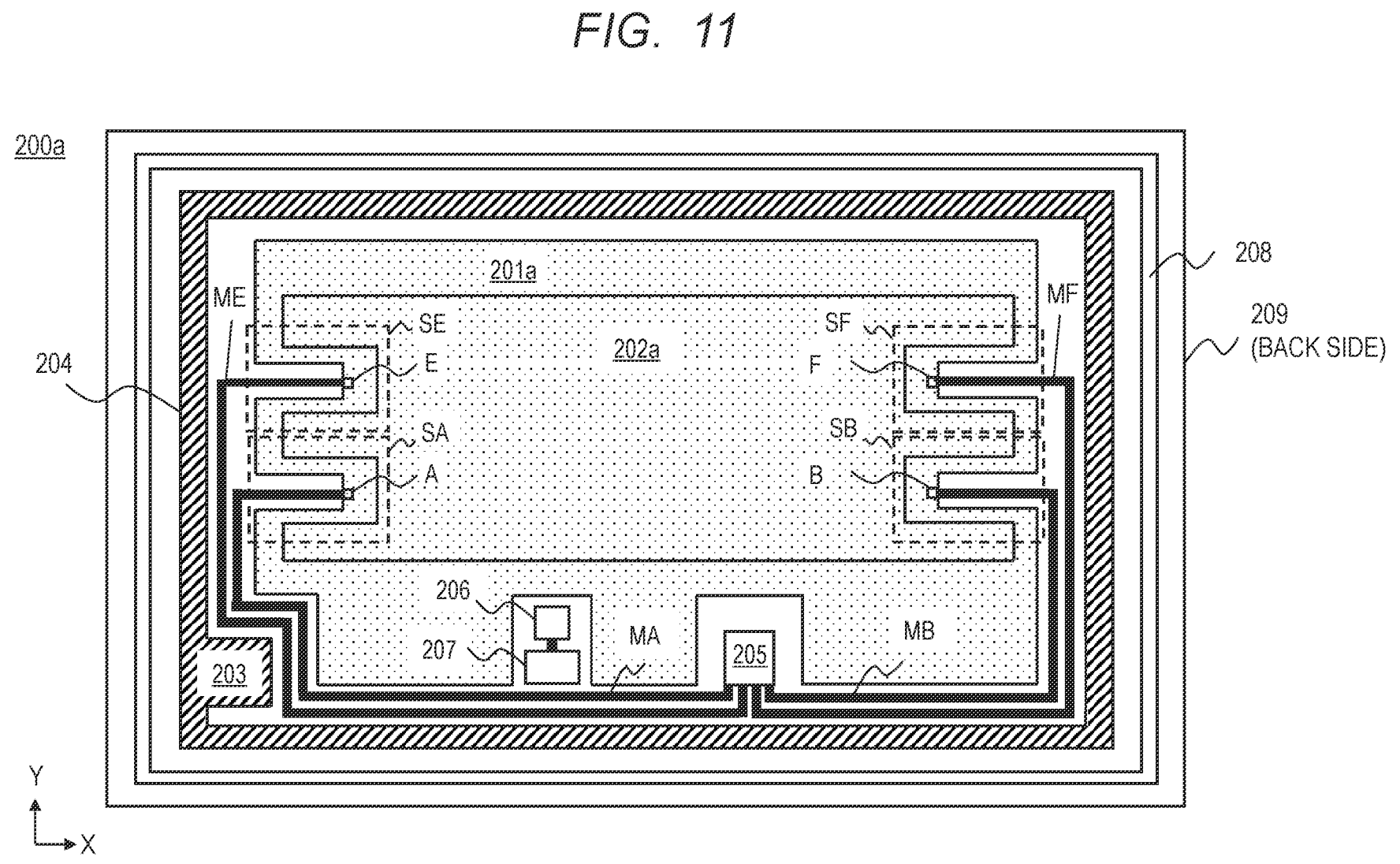

FIG. 11 is a plan view of a semiconductor-chip 200a according to a second embodiment. The difference from the first embodiment is that slits SE, SF are added to the source-electrode 201a (source pad 202a) so as to adjoin the slits SA, SB. In addition, a source-potential extraction port E is provided in the slit SE. A source-potential extraction port F is provided in the slit SF. The source-potential extraction port E is connected to the Kelvin pad 205 by a wire ME. The source-potential outlet F is connected to the Kelvin pad 205 by a wire MF.

Figure 12:
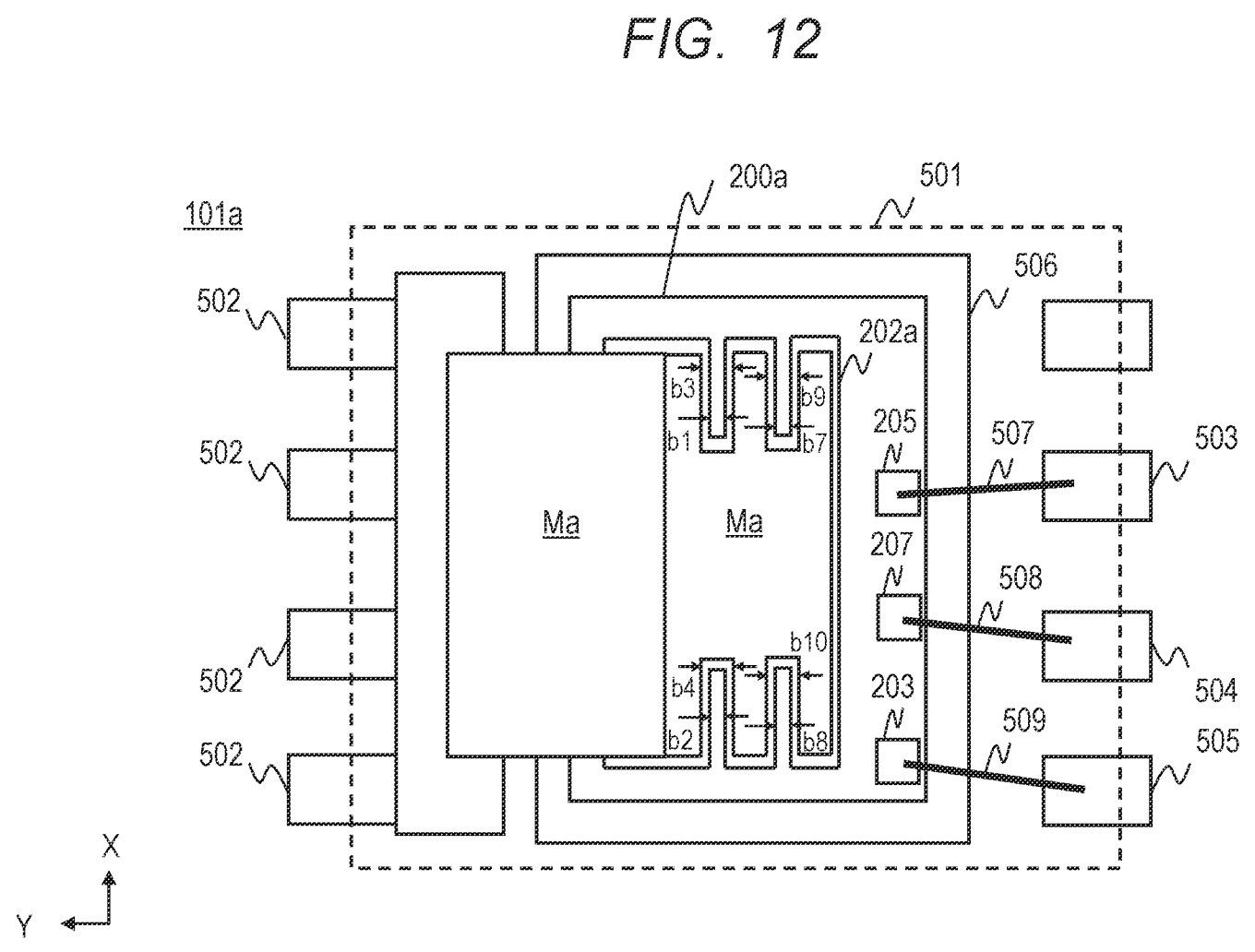

FIG. 12 is a plan view of a semiconductor device 101a using a semiconductor chip 200a. The connection portion Ma has slits corresponding to the slits SE, SF as in the case of the source-electrode 201a. Each slit width is the same as that of the first embodiment. As in the first embodiment, the connection portion Ma and the source electrode 201a (source pad 202a) are connected to each other in such a manner that they are slit-aligned with each other.

The effect of increasing the number of slits and the source potential extraction ports will be described. Since the potentials generated at the respective positions on the source electrode 201a are affected by the arrangement of the gate pad 203, the sense MOSFET103, and the Kelvin pad 205, the equipotential lines on the source electrode 201a are not always position with the uniform even around the connection connection portion M. By increasing the number of source-potential extraction ports, the number that determines the average value increases, so that the change in the potential detected by the Kelvin pad 205, that is, the change in RC is further suppressed.

As described above, in the semiconductor-chip 200a of the second embodiment, there are four slits and four source potential extraction ports provided in the source-electrode 201a. Further, the number of slits provided in the connection portion M was also 4. Accordingly, even if the connection position of the connection portion M varies, the influence on the sense ratio can be suppressed.

The present invention is not limited to the above-described embodiments, and various modifications can be made without departing from the gist of the present invention.

What is claimed is:

1. A semiconductor device comprising:
   a semiconductor chip;
   first and second source terminals;
   a drain terminal;
   a gate terminal;
   a Kelvin terminal; and
   a connection portion including a metal plate,
   wherein the semiconductor chip comprises:
      a first source electrode coupled to the first source terminal through the connection portion and having a first slit and a second slit on two opposite sides;
      a second source electrode coupled to the second source terminal;
      a drain electrode coupled to the drain terminal;
      a Kelvin pad coupled to the Kelvin terminal and formed independently of the first source electrode;
      a power MOSFET that has a source coupled to the first source electrode, a drain coupled to the drain electrode and a gate coupled to the gate terminal;
      a sense MOSFET that has a source coupled to the second source electrode, a drain coupled to the drain electrode and a gate coupled to the gate terminal;
      a first wire coupled between a first source potential extraction port set at the first slit and the Kelvin pad; and
      a second wire coupled between a second source potential extraction port set at the second slit and the Kelvin pad,
   wherein the connection portion has a third slit corresponding to the first slit and a fourth slit corresponding to the second slit.

2. The semiconductor device according to claim 1, further comprising:
   a source pad formed on the first source electrode,
   wherein the source pad is a square shape and has fifth and sixth slits corresponding to the first and second slits on two opposing sides, and
   wherein the connection portion is coupled to the first source electrode using the source pad.

3. The semiconductor device according to claim 1,
   wherein the first source electrode further includes a seventh slit adjacent the first slit and an eighth slit adjacent to the second slit, and
   wherein the connection portion further includes a ninth and tenth slits corresponding to the seventh and eighth slits.

4. The semiconductor device according to claim 3, further comprising:
   a source pad formed on the first source electrode,
   wherein the source pad is a square shape and has eleventh and twelfth slits corresponding to the first and seventh slits and thirteenth and fourteenth slits corresponding to the second and eight slits on two opposing sides, and wherein the connection portion is coupled to the first source electrode using the source pad.

5. The semiconductor device according to claim 1, wherein the first slit has a slit-width b1, the second slit has a slit-width b2, the third slit has a slit-width b3 (b3>b1) and the fourth slit has a slit-width b4 (b4>b2).

6. The semiconductor device according to claim 3, wherein the first slit has a slit-width b1, the second slit has a slit-width b2, the third slit has a slit-width b3 (b3>b1), the fourth slit has a slit-width b4 (b4>b2), the seventh slit has a slit-width b7, the eighth slit has a slit-width b8, the ninth slit has a slit-width b9 (b9>b7) and the tenth slit has a slit width b10 (b10>b8).

7. A control system, comprising:
a semiconductor device having a semiconductor chip, first and second source terminals, a drain terminal, a gate terminal, a Kelvin terminal, and a connection portion including a metal plate;
a current detection circuit coupled to the Kelvin terminal and the second source terminal; and
a control circuit which outputs a control signal to the gate terminal based on a current detected by the current detection circuit,
wherein the semiconductor chip comprises:
  a first source electrode coupled to the first source terminal through the connection portion and having a first slit and a second slit on two opposite sides;

a second source electrode coupled to the second source terminal;
a drain electrode coupled to the drain terminal;
a Kelvin pad coupled to the Kelvin terminal and formed independently of the first source electrode;
a power MOSFET that has a source coupled to the first source electrode, a drain coupled to the drain electrode and a gate coupled to the gate terminal;
a sense MOSFET that has a source coupled to the second source electrode, a drain coupled to the drain electrode and a gate coupled to the gate terminal;
a first wire coupled between a first source potential extraction port set at the first slit and the Kelvin pad;
a second wire coupled between a second source potential extraction port set at the second slit and the Kelvin pad,
wherein the connection portion has a third slit corresponding to the first slit and a fourth slit corresponding to the second slit.

8. The control system according to claim 7, further comprising:
a source pad formed on the first source electrode,
wherein the source pad is square shape and has fifth and sixth slits corresponding to the first and second slits on two opposing sides, and
wherein the connection portion is coupled to the first source electrode using the source pad.

* * * * *